(12) United States Patent
Yu

(10) Patent No.: US 11,239,282 B2
(45) Date of Patent: Feb. 1, 2022

(54) PIXEL STRUCTURE AND FABRICATION METHOD THEREOF, DISPLAY SUBSTRATE AND DISPLAY APPARATUS

(71) Applicant: BOE Technology Group Co., Ltd., Beijing (CN)

(72) Inventor: Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 794 days.

(21) Appl. No.: 16/070,802

(22) PCT Filed: Jan. 3, 2018

(86) PCT No.: PCT/CN2018/070163
§ 371 (c)(1),
(2) Date: Jul. 18, 2018

(87) PCT Pub. No.: WO2018/205652
PCT Pub. Date: Nov. 15, 2018

(65) Prior Publication Data
US 2021/0210562 A1      Jul. 8, 2021

(30) Foreign Application Priority Data

May 9, 2017   (CN) .......................... 201710321917.5

(51) Int. Cl.
*H01L 27/32*        (2006.01)
*H01L 51/56*        (2006.01)
(52) U.S. Cl.
CPC .......... *H01L 27/3218* (2013.01); *H01L 51/56* (2013.01); *H01L 27/3244* (2013.01)
(58) Field of Classification Search
None
See application file for complete search history.

(56) References Cited

U.S. PATENT DOCUMENTS 10,541,277 B2 *   1/2020   Kim ................... H01L 27/3246
2014/0307140 A1 * 10/2014   Hayashi ............. H04N 9/04557
                                                              348/281
(Continued)

FOREIGN PATENT DOCUMENTS

CN        103811533 A     5/2014
CN        104112824 A    10/2014
(Continued)

OTHER PUBLICATIONS

First Office Action dated Apr. 15, 2019 corresponding to Chinese application No. 201710321917.5.
(Continued)

*Primary Examiner* — Michelle Mandala
(74) *Attorney, Agent, or Firm* — Nath, Goldberg & Meyer; Joshua B. Goldberg

(57)         ABSTRACT

The present disclosure provides a pixel structure and a fabrication method thereof, a display substrate and a display apparatus. The pixel structure includes a plurality of first pixel portions arranged in a plurality of rows and a plurality of columns, and a second pixel portion that spaces the plurality of first pixel portions from each other. Each first pixel portion includes a plurality of first sub-pixels having a same color and arranged around a center of the first pixel portion. The second pixel portion includes a plurality of second sub-pixels. For four first pixel portions in two adjacent rows and two adjacent columns, each of four regions that are centrosymmetric and obtained by connecting centers of the four first pixel portions to each other corresponds to one pixel unit, and each pixel unit includes two first sub-pixels respectively in two first pixel portions and at least one second sub-pixel.

19 Claims, 2 Drawing Sheets

(56) References Cited

U.S. PATENT DOCUMENTS

| | | | |
|---|---|---|---|
| 2015/0130868 A1* | 5/2015 | Feng | G09G 3/2003 |
| | | | 345/694 |
| 2015/0311263 A1 | 10/2015 | Shih et al. | |
| 2016/0276416 A1* | 9/2016 | Ma | H01L 27/3216 |
| 2017/0309688 A1* | 10/2017 | Lee | H01L 27/3216 |

FOREIGN PATENT DOCUMENTS

| | | |
|---|---|---|
| CN | 104299974 A | 1/2015 |
| CN | 204257654 U | 4/2015 |
| CN | 104904015 A | 9/2015 |
| CN | 105576002 A | 5/2016 |
| CN | 106298855 A | 1/2017 |
| CN | 106653804 A | 5/2017 |
| CN | 107068729 A | 8/2017 |

OTHER PUBLICATIONS

International Search Report dated Apr. 2, 2018 corresponding to application No. PCT/CN2018/070163.

* cited by examiner

A-A'

US 11,239,282 B2

PIXEL STRUCTURE AND FABRICATION METHOD THEREOF, DISPLAY SUBSTRATE AND DISPLAY APPARATUS

CROSS-REFERENCE TO RELATED APPLICATION

This is a National Phase Application filed under 35 U.S.C. 371 as a national stage of PCT/CN2018/070163, filed on Jan. 3, 2018, an application claiming the benefit of priority to Chinese Patent Application No. 201710321917.5 filed on May 9, 2017, the contents of which are incorporated herein in their entirety by reference.

TECHNICAL FIELD

The present disclosure relates to the field of display technology, and particularly relates to a pixel structure and a fabrication method thereof, a display substrate and a display apparatus.

BACKGROUND

Organic Light-Emitting Diode (OLED) display panels have broad application prospects because of their advantages such as self-luminescence, fast response, and ease of implementing flexibility. In a full-color organic light-emitting display panel, pixel units include red (R), green (G), and blue (B) light-emitting units, and the light-emitting units are fabricated by vacuum evaporation and a solution process.

SUMMARY

The present disclosure provides a pixel structure, including a plurality of first pixel portions arranged in a plurality of rows and a plurality of columns, and a second pixel portion that spaces the plurality of first pixel portions from each other. Each of the plurality of first pixel portions includes a plurality of first sub-pixels having a same color and arranged around a center of the first pixel portion, and the second pixel portion includes a plurality of second sub-pixels.

For four first pixel portions in two adjacent rows and two adjacent columns, each of four regions that are centrosymmetric and obtained by connecting centers of the four first pixel portions to each other corresponds to one pixel unit, and the one pixel unit includes two first sub-pixels respectively in two first pixel portions and at least one second sub-pixel.

Optionally, any two first pixel portions adjacent in a row direction have different colors, any two first pixel portions adjacent in a column direction have different colors, each pixel unit includes one second sub-pixel, and in a single pixel unit, a color of the second sub-pixel is different from a color of each of the two first sub-pixels.

Optionally, each of the plurality of second sub-pixels has a same color.

Optionally, each of the first sub-pixels and the second sub-pixels is provided with a light-emitting functional layer, the light-emitting functional layers of the plurality of first sub-pixels included in a single first pixel portion are formed integrally, and the light-emitting functional layers of all of the second sub-pixels included in the second pixel portion are formed integrally.

Optionally, the first sub-pixels include red sub-pixels and green sub-pixels, and the second sub-pixels include blue sub-pixels.

Optionally, any two first pixel portions adjacent in a row direction have different colors, any two first pixel portions adjacent in a column direction have different colors, and each pixel unit includes a plurality of second sub-pixels. In a single pixel unit, the plurality of second sub-pixels include second sub-pixels having at least two different colors, and a color of each of the plurality of second sub-pixels is different from a color of each of the two first sub-pixels.

Optionally, any two first pixel portions adjacent in a row direction have a same color, any two first pixel portions adjacent in a column direction have a same color, and each pixel unit includes a plurality of second sub-pixels. In a single pixel unit, the plurality of second sub-pixels include second sub-pixels having at least two different colors, and a color of each of the plurality of second sub-pixels is different from a color of each of the two first sub-pixels.

Optionally, any two first pixel portions adjacent in a row direction have a same color, and any two first pixel portions adjacent in a column direction have different colors. In the pixel unit including two first sub-pixels having a same color and respectively located in two first pixel portions, a plurality of second sub-pixels are further included, a color of each of the plurality of second sub-pixels is different from a color of the two first sub-pixels. In the pixel unit including two first sub-pixels having different colors and respectively located in two first pixel portions, one second sub-pixel is further included, and a color of the one second sub-pixel is different from a color of each of the two first sub-pixels.

Optionally, an orthographic projection of the first pixel portion on a plane perpendicular to a thickness direction of the pixel structure is in a shape of a rectangle, and each first pixel portion includes eight first sub-pixels formed by dividing the first pixel portion along two diagonal lines of the first pixel portion and center lines of the first pixel portion in a width direction and a length direction of the first pixel portion.

Optionally, the orthographic projection of the first pixel portion on the plane perpendicular to the thickness direction of the pixel structure is in a shape of a square.

Optionally, a length of the second pixel portion between two first pixel portions adjacent in the row direction is 0.5 to 1 time as large as a side length of the square, and a length of the second pixel portion between two first pixel portions adjacent in the column direction is 0.5 to 1 time as large as the side length of the square.

Accordingly, the present disclosure further provides a fabrication method of a pixel structure, including:

forming a plurality of first pixel portions arranged in a plurality of rows and a plurality of columns, and a second pixel portion that spaces the plurality of first pixel portions from each other, each of the plurality of first pixel portions including a plurality of first sub-pixels having a same color and arranged around a center of the first pixel portion, and the second pixel portion including a plurality of second sub-pixels.

For four first pixel portions in any two adjacent rows and any two adjacent columns, each of four regions that are centrosymmetric and obtained by connecting centers of the four first pixel portions to each other corresponds to one pixel unit, and each pixel unit includes two first sub-pixels respectively in two first pixel portions and at least one second sub-pixel.

Optionally, any two first pixel portions adjacent in a row direction have different colors, any two first pixel portions adjacent in a column direction have different colors, all of the second sub-pixels have a same color, each pixel unit includes one second sub-pixel, and in a single pixel unit, a color of the second sub-pixel is different from a color of each of the two first sub-pixels.

Optionally, each of the first sub-pixels and the second sub-pixels is provided with a light-emitting functional layer, the light-emitting functional layers of the plurality of first sub-pixels included in a single first pixel portion are formed integrally, and the light-emitting functional layers of all of the second sub-pixels included in the second pixel portion are formed integrally.

Optionally, each of the first sub-pixels and the second sub-pixels is provided with a light-emitting functional layer, and the light-emitting functional layer in the second pixel portion is formed before the light-emitting functional layers in the first pixel portions are formed.

Optionally, any two first pixel portions adjacent in a row direction have different colors, any two first pixel portions adjacent in a column direction have different colors, and each pixel unit includes a plurality of second sub-pixels.

In a single pixel unit, the plurality of second sub-pixels include second sub-pixels having at least two different colors, and a color of each of the plurality of second sub-pixels is different from a color of each of the two first sub-pixels.

Optionally, any two first pixel portions adjacent in a row direction have a same color, any two first pixel portions adjacent in a column direction have a same color, and each pixel unit includes a plurality of second sub-pixels.

In a single pixel unit, the plurality of second sub-pixels include second sub-pixels having at least two different colors, and a color of each of the plurality of second sub-pixels is different from a color of each of the two first sub-pixels.

Optionally, an orthographic projection of the first pixel portion on a plane perpendicular to a thickness direction of the pixel structure is in a shape of a rectangle, and each first pixel portion includes eight first sub-pixels formed by dividing the first pixel portion along two diagonal lines of the first pixel portion and center lines of the first pixel portion in a width direction and a length direction of the first pixel portion.

Accordingly, the present disclosure further provides a display substrate, including the above pixel structure provided by the present disclosure.

Accordingly, the present disclosure further provides a display apparatus, including the above display substrate provided by the present disclosure.

BRIEF DESCRIPTION OF THE DRAWINGS

The accompanying drawings, which serve to provide a further understanding of the present disclosure and constitute a part of this specification, are used for explaining the present disclosure together with the following specific implementations, rather than limiting the present disclosure. In the drawings.

DETAILED DESCRIPTION

Specific implementations of the present disclosure will be described in detail below in conjunction with the accompanying drawings. It should be understood that, the specific implementations described herein are merely used for describing and explaining the present disclosure, rather than limiting the present disclosure.

In the fabrication process of a display panel, due to the limitations in mask alignment accuracy and devices, the fabrication of a high-resolution display panel has always been a problem. The resolution of the display panel can be improved by reducing a pixel area. In this case, however, in fabrication of a light-emitting unit of any color, the mask alignment accuracy needs to be improved, thus increasing process difficulty.

Figure 1:
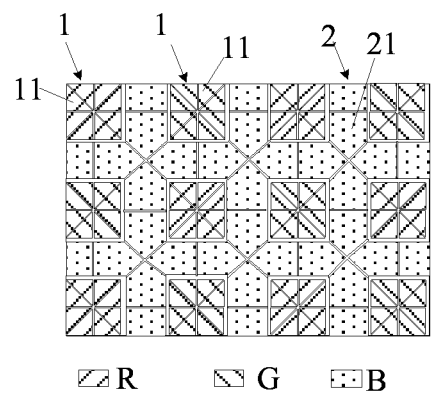
FIG. 1 is a schematic diagram illustrating arrangement of a pixel structure according to an embodiment of the present disclosure.
Figure 2:
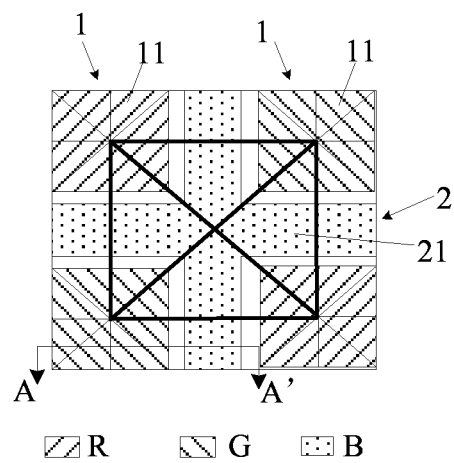
FIG. 2 is a partial schematic diagram of the pixel structure in FIG. 1.
Figure 3:
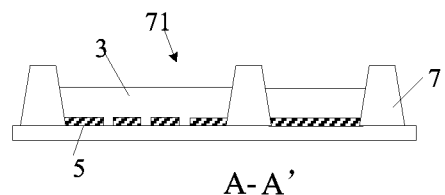
FIG. 3 is sectional view of the pixel structure taken along line A-A' in FIG. 2.

As an aspect of the present disclosure, a pixel structure is provided. FIG. 1 is a schematic diagram illustrating arrangement of a pixel structure according to an embodiment of the present disclosure, FIG. 2 is a partial schematic diagram of the pixel structure in FIG. 1, and FIG. 3 is sectional view of the pixel structure taken along line A-A' in FIG. 2. For ease of description, in the drawings, sub-pixels of different colors are shown with different hatching. According to the embodiment of the present disclosure, as shown in FIG. 1, the pixel structure includes a plurality of first pixel portions 1 arranged in a plurality of rows and a plurality of columns, and a second pixel portion 2 that spaces the plurality of first pixel portions 1 apart from each other. Each of the plurality of first pixel portions 1 includes a plurality of first sub-pixels 11 having a same color and arranged around a center of the first pixel portion 1. The second pixel portion 2 includes a plurality of second sub-pixels 21. For four first pixel portions 1 in two adjacent rows and two adjacent columns, each of four regions that are centrosymmetric and obtained by connecting centers of the four first pixel portions 1 to each other includes one pixel unit, and each pixel unit includes two first sub-pixels 11 respectively in two first pixel portions 1 and at least one second sub-pixel 21.

Figure 6:
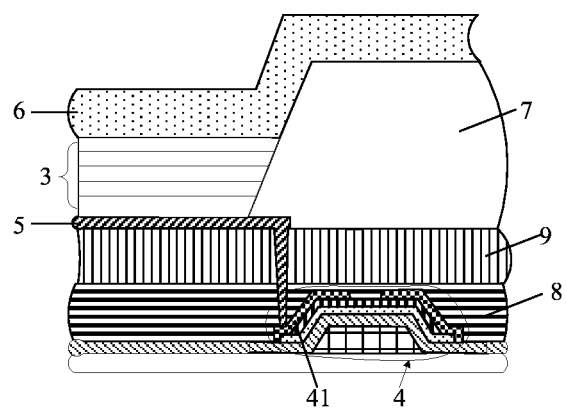
FIG. 6 is a sectional view of a pixel structure according to an embodiment of the present disclosure.

The pixel structure according to the embodiment of the present disclosure is especially suitable for use in an organic light emitting display panel. Each of the first sub-pixel 11 and the second sub-pixel 21 is an area that can display one color, and is provided with a light-emitting functional layer 3 (as shown in FIG. 6, the light-emitting functional layer 3 may specifically include an electron injection layer, an electron transport layer, a light-emitting layer, a hole transport layer, and a hole injection layer). In some embodiments, two adjacent first pixel portions 1 in a same row or a same column have different colors. As shown in FIG. 1, the first pixel portions 1 in a same row include first pixel portions 1 of red color and first pixel portions 1 of green color, which are alternately arranged, and the second pixel portion 2 is blue. Each first pixel portion 1 of red color includes a plurality of red sub-pixels (i.e., first sub-pixels 11), each first pixel portion 1 of green color includes a plurality of green sub-pixels (i.e., first sub-pixels 11), and the second pixel portion 2 of blue color includes a plurality of blue sub-pixels (i.e., second sub-pixels 21). Optionally, the first sub-pixel 11 in the first pixel portion 1 of red color may be provided therein with a red light-emitting functional layer to display red color R; the first sub-pixel 11 in the first pixel portion 1 of green color may be provided therein with a green light-emitting functional layer to display green color G; and the second sub-pixel 21 of blue color may be provided therein with a blue light-emitting functional layer to display blue color B. The pixel unit can display various desired colors by adjusting luminance of each sub-pixel.

In the embodiments of the present disclosure, because the plurality of first sub-pixels 11 in a single first pixel portion 1 belong to different pixel units, respectively, the first sub-pixel 11 included in one pixel unit has a small area, and thus high resolution can be achieved. In addition, because the first sub-pixels 11 in plural pixel units may be located in one first pixel portion 1, and an area of the first pixel portion 1 may be the same as an area of a conventional sub-pixel, the plurality of first sub-pixels 11 in one first pixel portion 1 may share one light-emitting functional layer, so that there is no need to increase the mask alignment accuracy at least when forming light-emitting functional layers of one color, thereby avoiding making the process too difficult while increasing the resolution.

According to the embodiment of the present disclosure, as shown in FIGS. 1 and 2, any two adjacent first pixel portions 1 in a same row have different colors, any two adjacent first pixel portions 1 in a same column also have different colors, all of the second sub-pixels 21 have a same color, each pixel unit includes one second sub-pixel 21, and in a single pixel unit, a color of the second sub-pixel 21 is different from a color of each of the two first sub-pixels 11. As shown in FIG. 2, each of four triangular regions that are centrosymmetric and defined by thick solid lines corresponds to one pixel unit, and each pixel unit includes a red sub-pixel and a green sub-pixel respectively from two first pixel portions 1 and a blue sub-pixel from the second pixel portion 2. In this way, an area of the second sub-pixel 21 can be made larger, thus reducing process difficulty.

Optionally, the light-emitting functional layers of the first sub-pixels 11 included in a single first pixel portion 1 are formed integrally, and the light-emitting functional layers of all of the second sub-pixels 21 in the second pixel portion 2 are formed integrally. In this way, an area of the light-emitting functional layer of the first pixel portion 1 is large, and an area of the light-emitting functional layer of the second pixel portion 2 is also large, thereby achieving high resolution with low alignment accuracy. Furthermore, in the fabrication process, the light-emitting functional layer of the second pixel portion 2 may be formed first, so that the light-emitting functional layer of the first pixel portion 1 can be surrounded by liquid environment when forming the light-emitting functional layer of the first pixel portion 1 by a solution process. Consequently, the light-emitting functional layer of the first pixel portion 1 has improved uniformity after being cured, and display effect is further enhanced.

By comparing the pixel structure according to the embodiments of the present disclosure with a conventional pixel structure, when the first pixel portion 1 and the second pixel portion 2 have a same area as a conventional sub-pixel, the mask alignment accuracy is similar, and the process difficulty is the same. However, in the pixel structure according to the embodiments of the present disclosure, the plurality of first sub-pixels 11 of a single first pixel portion 1 can be used in different pixel units, so that the pixel structure according to the embodiments of the present disclosure can have more pixel units, and have a resolution that is more than 2 times of the resolution of the conventional pixel structure, under the condition of a certain display area.

Optionally, the first sub-pixels 11 of one of any two adjacent first pixel portions 1 are red sub-pixels, the first sub-pixels 11 of the other of the two adjacent first pixel portions 1 are green sub-pixels, and the second sub-pixels 21 of the second pixel portion 2 are all blue sub-pixels.

According to an embodiment of the present disclosure, an orthographic projection of the first pixel portion 1 on a plane perpendicular to a thickness direction of the pixel structure is in a shape of a rectangle. Optionally, the orthographic projection of the first pixel portion 1 on the plane perpendicular to the thickness direction of the pixel structure is in a shape of a square. Each first pixel portion 1 includes eight first sub-pixels formed by dividing the first pixel portion 1 along two diagonal lines of the first pixel portion 1 and center lines of the first pixel portion 1 in a width direction and a length direction of the first pixel portion 1. The eight first sub-pixels have a same area, making color distribution of eight pixel units each including a respective one of the eight first sub-pixels more uniform.

Optionally, a length of the second pixel portion 2 between two first pixel portions 1 adjacent in the row direction is 0.5 to 1 time as large as a side length of the first pixel portion 1 in the shape of a square, and a length of the second pixel portion 2 between two first pixel portions 1 adjacent in the column direction is 0.5 to 1 time as large as the side length of the first pixel portion 1 in the shape of a square. In this way, a proportion of the second sub-pixel 21 in the pixel unit increases without affecting the display color. Particularly, in the case that the second sub-pixels 21 are blue sub-pixels, a proportion of the blue sub-pixel in each pixel unit increases, which can reduce influence on light emission effect due to poor lifetime of blue light.

Figure 4:
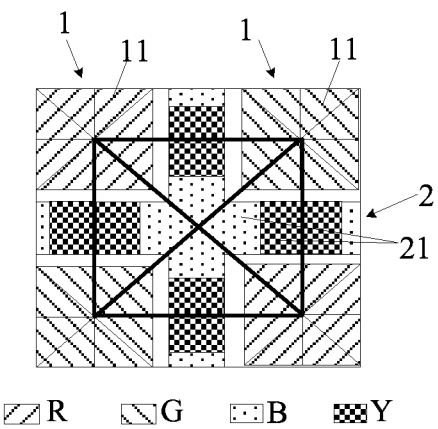
FIG. 4 is a schematic diagram illustrating arrangement of a pixel structure according to another embodiment of the present disclosure.

FIG. 4 is a schematic diagram illustrating arrangement of a pixel structure according to another embodiment of the present disclosure. As shown in FIG. 4, in the pixel structure according to the embodiment of the present disclosure, any two adjacent first pixel portions 1 in a same row have different colors, any two adjacent first pixel portions 1 in a same column also have different colors, each pixel unit includes a plurality of second sub-pixels 21, and in a single pixel unit, the plurality of second sub-pixels 21 include second sub-pixels 21 having at least two different colors, and a color of each of the plurality of second sub-pixels 21 is different from a color of each of the two first sub-pixels 11. In the example shown in FIG. 4, two first pixel portions 1 in the first row are sequentially a first pixel portion 1 of red color and a first pixel portion 1 of green color, two first pixel portions 1 in the second row are sequentially a first pixel portion 1 of green color and a first pixel portion 1 of red color, each of four triangular regions that are centrosymmetric and defined by thick solid lines corresponds to one pixel unit, and each pixel unit includes a red sub-pixel and a green sub-pixel respectively from two first pixel portions 1 and a blue sub-pixel and a yellow sub-pixel (i.e., two second sub-pixels 21 having different colors) from the second pixel portion 2.

Figure 5:
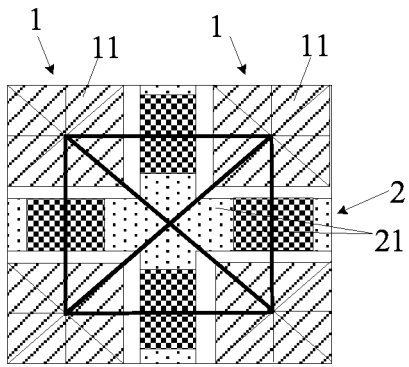
FIG. 5 is a schematic diagram illustrating arrangement of a pixel structure according to still another embodiment of the present disclosure.

FIG. 5 is a schematic diagram illustrating arrangement of a pixel structure according to still another embodiment of the present disclosure. As shown in FIG. 5, in the pixel structure according to the embodiment of the present disclosure, any two adjacent first pixel portions 1 in a same row have a same color, any two adjacent first pixel portions 1 in a same column also have a same color, each pixel unit includes a plurality of second sub-pixels 21, and in a single pixel unit, the plurality of second sub-pixels 21 include second sub-pixels 21 having at least two different colors, and a color of each of the plurality of second sub-pixels 21 is different from a color of each of the two first sub-pixels 1. In the example shown in FIG. 5, four first pixel portions 1 are all red, each of four triangular regions that are centrosymmetric and defined by thick solid lines corresponds to one pixel unit, each pixel unit includes red sub-pixels respectively from two first pixel portions 1 and a blue sub-pixel and a yellow sub-pixel (i.e., two second sub-pixels 21 having different colors) from the second pixel portion 2, and thus, color display can be achieved. It should be understood that each pixel unit may also include second sub-pixels 21 of other quantity or other colors, as long as the color types of the first sub-pixels 11 and the second sub-pixels 21 in each pixel unit are various to achieve color display. Optionally, any two adjacent first pixel portions 1 in a same row have a same color, and any two adjacent first pixel portions 1 in a same column have different colors. In this case, of four pixel units in FIG. 5, each of upper and lower pixel units may be provided therein with two second sub-pixels 21 having different colors, and each of left and right pixel units may be provided therein with only one second sub-pixel 21.

In the arrangement shown in FIGS. 4 and 5, shapes and sizes of the first pixel portion 1 and the second pixel portion 2 may be the same as those shown in FIG. 2, and are not repeatedly described herein.

According to an embodiment of the present disclosure, as shown in FIG. 6, the pixel structure further includes a thin film transistor 4, a passivation layer 8 provided on the thin film transistor 4, a planarization layer 9 provided on the passivation layer 8, a pixel definition layer 7 provided on the planarization layer 9, gate lines, data lines, and other structures. Each of the first sub-pixels 11 and the second sub-pixels 21 corresponds to one thin film transistor 4. A plurality of pixel openings 71 (see FIG. 3) are formed in the pixel definition layer 7, and the light-emitting functional layers 3 are disposed in the pixel openings 71. In the case that the light-emitting functional layers 3 of plural sub-pixels are formed integrally, the light-emitting functional layers 3 having an integral structure are disposed in a single pixel opening 71. As shown in FIG. 3, one first pixel portion 1 corresponds to one pixel opening 71; in the case that the light-emitting functional layers of all the second sub-pixels 21 are formed integrally, the second pixel portion 2 also corresponds to one pixel opening 71. As shown in FIGS. 3 and 6, a cathode layer 6 is further provided above the light-emitting functional layer 3, and an anode 5 is provided below the light-emitting functional layer 3. Each first sub-pixel 11 corresponds to one anode 5, and each second sub-pixel 21 also corresponds to one anode 5. The anode 5 is connected to a drain electrode 41 of the thin film transistor 4 of a corresponding sub-pixel through a via hole penetrating through the planarization layer 9 and the passivation layer 8. When the anode 5 and the cathode layer 6 are applied with positive and negative electrical signals, respectively, a part of the light-emitting functional layer 3 between the anode 5 and the cathode layer 6 emits light. The gate lines and the data lines are arranged to intersect each other, and each sub-pixel (each of the first sub-pixels 11 and the second sub-pixels 21) is located at an intersection of a corresponding gate line and a corresponding data line. When the corresponding gate line provides a scan signal, the thin film transistor 4 corresponding to the sub-pixel at the intersection is turned on, so that the signal on the corresponding data line is applied to the anode 5 connected to the thin film transistor 4, thus making the part of the light-emitting functional layer 3 between the anode 5 and the cathode layer 6 emit light.

As another aspect of the present disclosure, there is provided a fabrication method of the above pixel structure, including forming a plurality of first pixel portions arranged in a plurality of rows and a plurality of columns, and a second pixel portion that spaces the plurality of first pixel portions apart from each other.

Each of the plurality of first pixel portions includes a plurality of first sub-pixels having a same color and arranged around a center of the first pixel portion.

The second pixel portion includes a plurality of second sub-pixels.

For four first pixel portions in two adjacent rows and two adjacent columns, each of four regions that are centrosymmetric and obtained by connecting centers of the four first pixel portions to each other corresponds to one pixel unit, and each pixel unit includes two first sub-pixels respectively in two first pixel portions and at least one second sub-pixel.

According to an embodiment of the present disclosure, as shown in FIGS. 1 and 2, any two adjacent first pixel portions 1 in a same row have different colors, any two adjacent first pixel portions 1 in a same column also have different colors, all of the second sub-pixels 21 have a same color, each pixel unit includes one second sub-pixel 21, and in a single pixel unit, a color of the second sub-pixel 21 is different from a color of each of the two first sub-pixels 11.

According to an embodiment of the present disclosure, each of the first sub-pixels 11 and the second sub-pixels 21 is provided with a light-emitting functional layer 3, the light-emitting functional layers 3 of the first sub-pixels included in a same first pixel portion 1 are formed integrally, and the light-emitting functional layers 3 of all of the second sub-pixels 21 of the second pixel portion 2 are formed integrally. It can be understood that the color of each of the first sub-pixels 11 and the second sub-pixels 21 is determined by the color of the respective light-emitting functional layer 3.

According to an embodiment of the present disclosure, the fabrication method further includes forming a pixel definition layer 7 having a plurality of pixel openings 71. Each first pixel portion 1 corresponds to one pixel opening 71, and the second pixel portion 2 corresponds to one pixel opening 71. It can be understood that the shapes of the pixel openings 71 decide the shapes of the first pixel portions 1 and the second pixel portion 2. According to an embodiment of the present disclosure, in the formation of the pixel definition layer 7, a film may be formed by plasma enhanced chemical vapor deposition (PECVD), spin-coating, slit-coating, etc., and the pixel openings in the pixel definition layer 7 may be formed by a photolithographic patterning process.

According to an embodiment of the present disclosure, forming the plurality of first pixel portions 1 includes: forming the light-emitting functional layer 3 of a desired color in the pixel opening 71 corresponding to each first pixel portion 1, wherein the light-emitting functional layers 3 of the first pixel portions 1 having a same color are formed simultaneously. Forming the second pixel portion 2 includes: forming the light-emitting functional layer 3 of a desired color in the pixel opening 71 corresponding to the second pixel portion 2. Optionally, before forming the light-emitting functional layers 3 of the first pixel portions 1 and the second pixel portion 2, the fabrication method further includes: forming a plurality of anodes 5, each of which corresponds to one first sub-pixel 11 or one second sub-pixel 21. Optionally, after forming the light-emitting functional layers 3 of the first pixel portions 1 and the second pixel portion 2, the fabrication method further includes: forming a cathode layer 6. Optionally, the plurality of anodes 5 are made of a transparent material such as indium tin oxide (ITO) or the like, and the cathode layer 6 is made of a non-transparent metal material such as silver or the like, so that the pixel structure is formed into a bottom emission structure. Optionally, the plurality of anodes 5 are made of a metal material, and the cathode layer 6 is made of a transparent material, so as to implement a top emission structure. Further, it should be understood that, the thin film transistors 4 corresponding to the respective sub-pixels (the first sub-pixels 11 and the second sub-pixels 21) are independent of each other, and the anodes 5 corresponding to the respective sub-pixels are insulated from each other and independently controlled by respective thin film transistors 4.

Optionally, the step of forming the light-emitting functional layer 3 of a desired color in the pixel opening 71 corresponding to the second pixel portion 2 may be performed prior to the step of forming the light-emitting functional layer 3 of a desired color in the pixel opening 71 corresponding to each first pixel portion 1. In this way, when forming the light-emitting functional layers 3 of the first pixel portions 1 by a solution process, each first pixel portion 1 is in a uniform liquid environment, thus improving uniformity of the light-emitting functional layers 3 of different first pixel portions 1, and further enhancing display effect. Optionally, the light-emitting functional layer 3 may be formed by a printing method.

According to an embodiment of the present disclosure, as shown in FIGS. 1 and 2, an orthographic projection of the first pixel portion 1 on a plane perpendicular to a thickness direction of the pixel structure is in a shape of a rectangle. Optionally, the orthographic projection of the first pixel portion 1 on the plane perpendicular to the thickness direction of the pixel structure is in a shape of a square. Each first pixel portion 1 includes eight first sub-pixels 11 formed by dividing the first pixel portion 1 along two diagonal lines of the first pixel portion 1 and center lines of the first pixel portion 1 in a width direction and a length direction of the first pixel portion 1. In this case, the pixel opening 71, corresponding to the first pixel portion 1, in the pixel definition layer 7 is in a shape of a rectangle, and each first pixel portion 1 corresponds to eight anodes 5, which are respectively in eight areas obtained by dividing the pixel opening 71 along two diagonal lines of the pixel opening 71 and center lines of the pixel opening 71 in a width direction and a length direction of the pixel opening 71.

As described above, the pixel structure may also be arranged as shown in FIGS. 4 and 5. The arrangement may be implemented by means of the shapes of the pixel openings 71 in the pixel definition layer 7, the colors of the light-emitting functional layers 3, and the distribution of the anodes 5. In fabrication of the pixel structure in FIGS. 4 and 5, each first pixel portion 11 corresponds to one pixel opening 71, in which the light-emitting functional layers 3 of a corresponding color is provided, and a plurality of anodes 5 in one-to-one correspondence with the plurality of first sub-pixels 11 are provided below each first pixel portion 1. Optionally, the second sub-pixels 21 that are adjacent and have a same color correspond to one pixel opening 71, in which light-emitting functional layers having a corresponding color and formed integrally are provided, and one anode 5 is provided below each second sub-pixel 21. Optionally, each second sub-pixel 21 corresponds to one pixel opening 71, in which the light-emitting functional layer 3 having a corresponding color is provided, the light-emitting function layers 3 of adjacent second sub-pixels 21 are spaced apart by the pixel definition layer 7, and one anode 5 is disposed below each second sub-pixel 21.

In fabrication of the pixel structure shown in FIGS. 4 and 5, the shapes of the openings of the pixel definition layer 7 may be controlled such that the orthographic projection of the first pixel portion 1 on the plane perpendicular to the thickness direction of the pixel structure is in a shape of a square. In each pixel unit, a length of the second pixel portion 2 between two first pixel portions 1 adjacent in the row direction is 0.5 to 1 time as large as a side length of the first pixel portion 1 in the shape of a square, and a length of the second pixel portion 2 between two first pixel portions 1 adjacent in the column direction is 0.5 to 1 time as large as the side length of the first pixel portion 1 in the shape of a square.

After forming structures such as the pixel definition layer 7, the light-emitting functional layers 3, the cathode layer 6 and the like, the pixel structure can also be packaged by means of Frit, Dam & Fill, Face Seal, Thin Film Encapsulation (TFE), or the like.

As still another aspect of the present disclosure, there is provided a display substrate, including the above-described pixel structure. The display substrate may be an organic light emitting diode (OLED) display panel.

As yet another aspect of the present disclosure, there is provided a display apparatus, including the above-described display substrate. The display apparatus may be a product or component having a display function, such as a mobile phone, a television, a notebook computer, a digital photo frame, or the like.

The pixel structure and the fabrication method thereof, the display substrate, and the display apparatus provided in the present disclosure are described above. It can be seen that because the plurality of first sub-pixels in a single first pixel portion belong to different pixel units, respectively, the first sub-pixel included in one pixel unit has a small area, and thus high resolution can be achieved. In addition, because the first sub-pixels in plural pixel units are located in one first pixel portion, and an area of the first pixel portion can be the same as an area of a conventional sub-pixel, the plurality of first sub-pixels in one first pixel portion can share one light-emitting functional layer, so that there is no need to increase the mask alignment accuracy at least when forming the light-emitting functional layers of one color, thereby avoiding making the process too difficult while increasing the resolution. Furthermore, the light-emitting functional layers in the plurality of second sub-pixels of the second pixel portion are formed integrally, which decreases process difficulty, and in the case that the second sub-pixels are blue, blue light emission area can increase, and influence of poor lifetime of blue light on light emission effect can be reduced.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A pixel structure, comprising a plurality of first pixel portions arranged in a plurality of rows and a plurality of columns, and a second pixel portion that spaces the plurality of first pixel portions apart from each other, wherein each of the plurality of first pixel portions comprises a plurality of first sub-pixels having a same color and arranged around a center of the first pixel portion, the second pixel portion comprises a plurality of second sub-pixels;
for four first pixel portions in two adjacent rows and two adjacent columns, each of four regions that are centrosymmetric and obtained by connecting centers of the four first pixel portions to each other corresponds to one pixel unit, and the one pixel unit comprises two first sub-pixels respectively in two first pixel portions and at least one second sub-pixel, and
an orthographic projection of the first pixel portion on a plane perpendicular to a thickness direction of the pixel structure is in a shape of a rectangle, a length of the second pixel portion between two first pixel portions adjacent in the row direction is 0.5 to 1 times as large as a side length of the rectangle, and a length of the second pixel portion between two first pixel portions adjacent in the column direction is 0.5 to 1 times as large as the side length of the rectangle.

2. The pixel structure of claim 1, wherein any two first pixel portions adjacent in a row direction have different colors, any two first pixel portions adjacent in a column direction have different colors, each pixel unit comprises one second sub-pixel, and in a single pixel unit, a color of the second sub-pixel is different from a color of each of the two first sub-pixels.

3. The pixel structure of claim 2, wherein each of the plurality of second sub-pixels has a same color.

4. The pixel structure of claim 3, wherein each of the first sub-pixels and the second sub-pixels is provided with a light-emitting functional layer, the light-emitting functional layers of the plurality of first sub-pixels comprised in a single first pixel portion are formed integrally, and the light-emitting functional layers of the plurality of second sub-pixels comprised in the second pixel portion are formed integrally.

5. The pixel structure of claim 3, wherein the first sub-pixels comprise red sub-pixels and green sub-pixels, and the second sub-pixels comprise blue sub-pixels.

6. The pixel structure of claim 1, wherein any two first pixel portions adjacent in a row direction have different colors, any two first pixel portions adjacent in a column direction have different colors, each pixel unit comprises a plurality of second sub-pixels, and
in a single pixel unit, the plurality of second sub-pixels comprise second sub-pixels having at least two different colors, and a color of each of the plurality of second sub-pixels is different from a color of each of the two first sub-pixels.

7. The pixel structure of claim 1, wherein any two first pixel portions adjacent in a row direction have a same color, any two first pixel portions adjacent in a column direction have a same color, each pixel unit comprises a plurality of second sub-pixels, and
in a single pixel unit, the plurality of second sub-pixels comprise second sub-pixels having at least two different colors, and a color of each of the plurality of second sub-pixels is different from a color of each of the two first sub-pixels.

8. The pixel structure of claim 1, wherein any two first pixel portions adjacent in a row direction have a same color, any two first pixel portions adjacent in a column direction have different colors,
in the pixel unit comprising two first sub-pixels having a same color and respectively located in two first pixel portions, a plurality of second sub-pixels are further comprised, a color of each of the plurality of second sub-pixels is different from a color of the two first sub-pixels, and
in the pixel unit comprising two first sub-pixels having different colors and respectively located in two first pixel portions, one second sub-pixel is further comprised, and a color of the one second sub-pixel is different from a color of each of the two first sub-pixels.

9. The pixel structure of claim 1, wherein each first pixel portion comprises eight first sub-pixels formed by dividing the first pixel portion along two diagonal lines of the first pixel portion and center lines of the first pixel portion in a width direction and a length direction of the first pixel portion.

10. The pixel structure of claim 9, wherein the orthographic projection of the first pixel portion on the plane perpendicular to the thickness direction of the pixel structure is in a shape of a square.

11. A fabrication method of a pixel structure, comprising:
forming a plurality of first pixel portions arranged in a plurality of rows and a plurality of columns, and a second pixel portion that spaces the plurality of first pixel portions from each other, each of the plurality of first pixel portions comprising a plurality of first sub-pixels having a same color and arranged around a center of the first pixel portion, the second pixel portion comprising a plurality of second sub-pixels;
wherein for four first pixel portions in two adjacent rows and two adjacent columns, each of four regions that are centrosymmetric and obtained by connecting centers of the four first pixel portions to each other corresponds to one pixel unit, and each pixel unit comprises two first sub-pixels respectively in two first pixel portions and at least one second sub-pixel, and
an orthographic projection of the first pixel portion on a plane perpendicular to a thickness direction of the pixel structure is in a shape of a rectangle, a length of the second pixel portion between two first pixel portions adjacent in the row direction is 0.5 to 1 times as large as a side length of the rectangle, and a length of the second pixel portion between two first pixel portions adjacent in the column direction is 0.5 to 1 times as large as the side length of the rectangle.

12. The fabrication method of claim 11, wherein any two first pixel portions adjacent in a row direction have different colors, any two first pixel portions adjacent in a column direction have different colors, all of the second sub-pixels have a same color, each pixel unit comprises one second sub-pixel, and in a single pixel unit, a color of the second sub-pixel is different from a color of each of the two first sub-pixels.

13. The fabrication method of claim 12, wherein each of the first sub-pixels and the second sub-pixels is provided with a light-emitting functional layer, the light-emitting functional layers of the plurality of first sub-pixels comprised in a single first pixel portion are formed integrally, and the light-emitting functional layers of the plurality of second sub-pixels comprised in the second pixel portion are formed integrally.

14. The fabrication method of claim 11, wherein each of the first sub-pixels and the second sub-pixels is provided with a light-emitting functional layer, and the light-emitting functional layer in the second pixel portion is formed before the light-emitting functional layers in the first pixel portions are formed.

15. The fabrication method of claim 11, wherein any two first pixel portions adjacent in a row direction have different colors, any two first pixel portions adjacent in a column direction have different colors, each pixel unit comprises a plurality of second sub-pixels, and in a single pixel unit, the plurality of second sub-pixels comprise second sub-pixels having at least two different colors, and a color of each of the plurality of second sub-pixels is different from a color of each of the two first sub-pixels.

16. The fabrication method of claim 11, wherein any two first pixel portions adjacent in a row direction have a same color, any two first pixel portions adjacent in a column direction have a same color, each pixel unit comprises a plurality of second sub-pixels, and in a single pixel unit, the plurality of second sub-pixels comprise second sub-pixels having at least two different colors, and a color of each of the plurality of second sub-pixels is different from a color of each of the two first sub-pixels.

17. The fabrication method of claim 11, wherein each first pixel portion comprises eight first sub-pixels formed by dividing the first pixel portion along two diagonal lines of the first pixel portion and center lines of the first pixel portion in a width direction and a length direction of the first pixel portion.

18. A display substrate, comprising the pixel structure of claim 1.

19. A display apparatus, comprising the display substrate of claim 18.

* * * * *